United States Patent [19]
Tso et al.

[11] Patent Number: 5,917,383
[45] Date of Patent: Jun. 29, 1999

[54] COMPACT VOLTAGE CONTROLLED RING OSCILLATOR WITH QUADRATURE OUTPUTS

[75] Inventors: Robert Tso, South San Gabriel; Ray Michael Herman, Huntington Beach, both of Calif.

[73] Assignee: SiRF Technology, Inc., Santa Clara, Calif.

[21] Appl. No.: 08/979,191

[22] Filed: Nov. 26, 1997

[51] Int. Cl.$^6$ ........................................ H03B 5/02
[52] U.S. Cl. .................... 331/57; 331/135; 331/177 R
[58] Field of Search .................. 331/57, 135, 177 R

[56] References Cited

U.S. PATENT DOCUMENTS

| | | | |
|---|---|---|---|
| 4,884,041 | 11/1989 | Walker | 331/57 |
| 5,172,076 | 12/1992 | Brown | 331/135 |
| 5,489,878 | 2/1996 | Gilbert | 331/135 |
| 5,635,879 | 6/1997 | Sutardja | 331/135 |

*Primary Examiner*—Siegfried H. Grimm
*Attorney, Agent, or Firm*—Dennis & Irene Fernandez LLP

[57] ABSTRACT

The compact voltage controlled ring oscillator includes two variable delay gates (VDGs). Each input port of one variable delay gate is connected to the output port of the other variable delay gate to form a feedback loop. A control interface receives an input voltage control signal (VCON), and generates a limited and buffered voltage control signal VX, which is provided to each of the VDGs to generate VDG bias currents which are limited and monotonic with VCON. Each VDG comprises a fixed bias differential transconductance gain stage (GM1), a variable bias differential transconductance hysteresis feedback stage (GM2), and a variable bias voltage follower stage. The combination of delay control from variable hysteresis and variable voltage follower output resistance provides a compact, low power ring oscillator VCO, with over an octave of tuning range.

8 Claims, 4 Drawing Sheets

COMPACT VOLTAGE CONTROLLED RING OSCILLATOR WITH QUADRATURE OUTPUTS

FIELD OF THE INVENTION

The invention relates in general to voltage controlled oscillators, and in particular to compact, low power, monolithic voltage controlled ring oscillators.

BACKGROUND OF THE INVENTION

Monolithic voltage controlled oscillators (VCOs) are widely used elements in typical communication systems. VCOs are typically used in wireless transmitter/receiver (T/R) building blocks, such as a Phase Locked Loop (PLL) type frequency synthesizer. Although many applications require a single fixed frequency, the VCO must still be capable of providing adequate tuning range to cover shifts in center frequency which result from normal parametric variations found in any semiconductor process. In addition to serving as tunable oscillator within a PLL, many T/R applications require both In-phase (I) and Quadrature (Q) phase Local Oscillator (LO) signals, for In-phase and Quadrature (I-Q) conversion of voltage signals. Since the ring-type oscillator oscillates with a total additive phase shift around the loop of 360 degrees, I-Q signals can easily be produced using an even number of delay elements in the loop, and closing the feedback loop with a wired inversion, such as with differential signals which provides 180 degrees of phase shift. Thus, with two delay elements, each element provides 90 degrees of phase shift at the frequency of oscillation.

Typical prior art monolithic ring type VCO, such as shown in U.S. Pat. No. 4,884,041, uses a linear combination or interpolation technique consisting of a plurality of simple logic gate inverters and a linear combiner circuit combined to achieve variable delay. According to the prior art invention, the minimum number of functional components for a VCO with quadrature outputs are two logic gates and two combiner circuits. However, it is desirable to provide a VCO that provides over an octave of tuning range using fewer components and less power to thereby lower device cost, whereas the invention herein achieves the same function with the equivalent complexity of two combiner circuits. The elimination of two logic gates in a bipolar implementation saves 14 transistors and 10 resistors.

SUMMARY OF THE INVENTION

A compact voltage controlled ring oscillator with quadrature outputs is provided according to the principle of this invention comprising two variable delay gates (VDGs), a first variable delay gate and a second variable delay gate. Each of the variable delay gates has an input port to receive a differential input signal (+VIN, −VIN), and an output port to transmit a differential output signal (+VOUT, −VOUT), wherein each input port of one variable delay gate is connected to the output port of the other variable delay gate to form a feedback loop. A controlled voltage signal (VX) is provided to each variable delay gate from a control interface (CI) circuit. The control interface receives a VCO input control voltage signal (VCON) ranging from GND to +VCC, and correspondingly generates a reduced spanning output control voltage (VX), which is used by the VDGs to generate the appropriate variable VDG bias currents.

Each variable delay gate comprises load resistors, a fixed bias differential transconductance gain stage (GM1), a variable bias differential transconductance stage (GM2), and a variable bias differential voltage follower stage having variable current sources IG3 and IG4, wherein the GM1 is biased by a current source IDP which is substantially independent of input control signal VCON. The GM2 bias current source (IHY) varies inversely with VCON, while IG3 and IG4 are substantially equal and vary non-inversely with VCON. The GNU stage has its differential inputs and outputs connected in a manner as to provide local positive feedback within the VDG to increase the propagation delay through the variable delay gate, with the amount of delay increasing with increasing values of IHY. In contrast, as the bias currents for the voltage followers are increased, the output resistance ($r_{out} \sim 1/g_m$ for bipolar) is reduced, thus improving the drive capability and reducing the propagation delay through the variable delay gate. For low values of VCON, IG3 and IG4 are minimized to some non-zero value, while IHY is maximized, thereby producing the maximum VDG delay. For high values of VCON, IG3 and IG4 currents are maximize while IHY is minimized, thus producing the minimum gate delay. Buffers may be connected to the outputs of the variable delay gates to provide load isolation and reduce the sensitivity of VDG delay to variable load conditions.

In prior art invention, the minimum number of functional components for a VCO with quadrature outputs are two logic gates and two combiner circuits, whereas, the invention herein achieves the same function with the equivalent complexity of two combiner circuits. The elimination of two logic gates in a bipolar implementation saves 14 transistors and 10 resistors, thus requiring fewer components and less power to thereby lower device cost.

DETAILED DESCRIPTION

Figure 1:
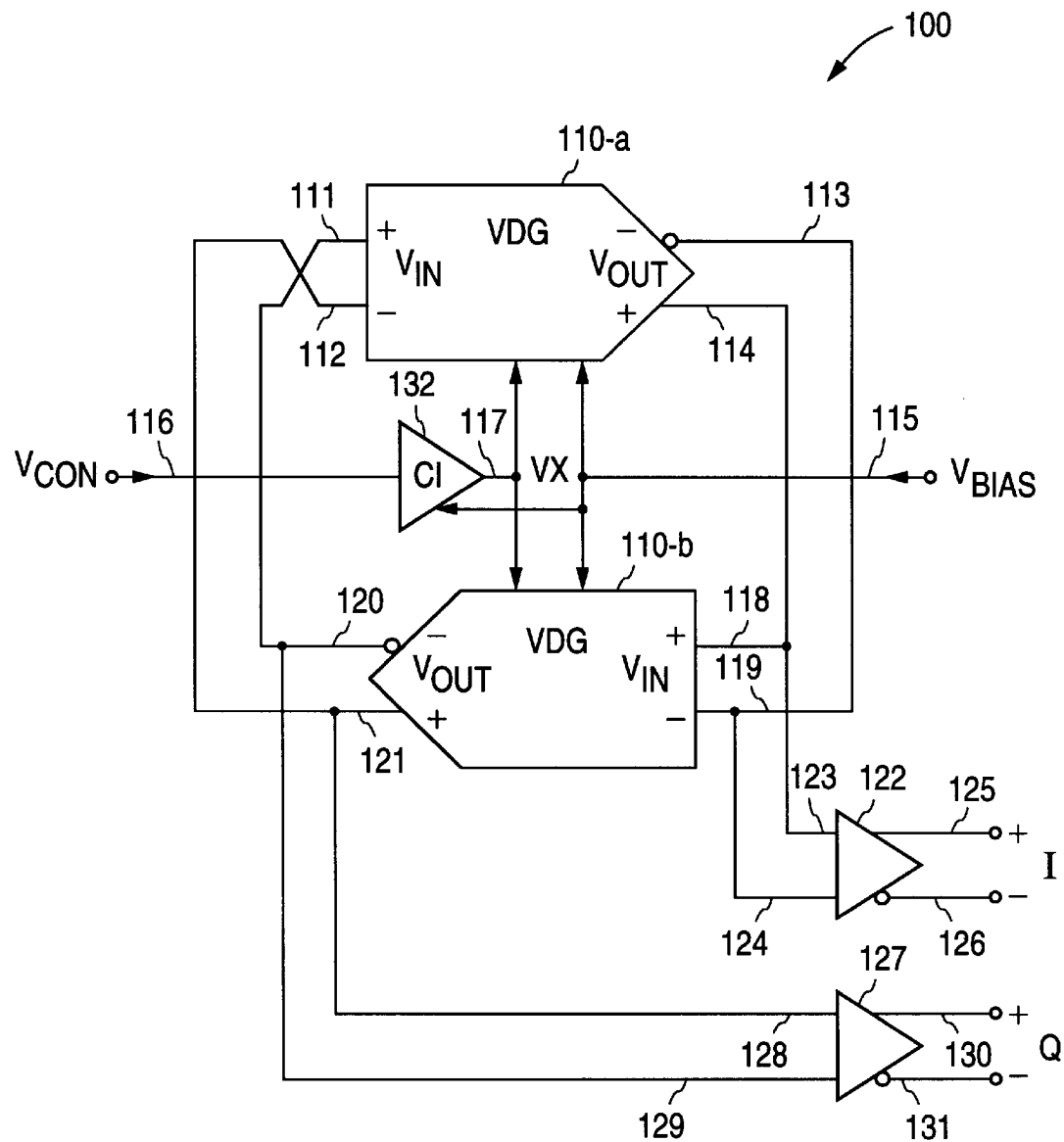
FIG. 1 illustrates a compact voltage controlled ring oscillator with quadrature outputs provided in accordance with the principles of this invention.

FIG. 1 illustrates a compact voltage controlled ring oscillator with quadrature outputs (VCO) 100 provided in accordance with the principles of this invention. VCO 100 comprises two variable delay gates (VDGs) 110, such as variable delay gate VDG 110-*a* and VDG 110-*b* shown in FIG. 1. Each VDG 110, such as VDG 110-*a* and VDG 110-*b*, comprises an input port to receive a differential input signal (+VIN, −VIN), and an output port to transmit a differential output signal (+VOUT, −VOUT), wherein each input port of one VDG 110 is connected to the output port of another VDG 110 to form an oscillatory feedback loop, i.e. a ring oscillator. As shown in FIG. 1, first VDG 110-*a* comprises an output port 113 and 114 that is coupled to an input port 119 and 118 of a second VDG 110-*b*, while an output port 120 and 121 of second VDG 110-*b* is coupled to an input port 111 and 112 of first VDG 110-*a*. A controlled voltage signal (VX) 117 is provided to each variable delay gate 110-*a* and 110-*b* from a control interface (CI) circuit 132. Control interface 132 receives an input control voltage signal (VCON) 116 ranging from GND to +VCC, and generates correspondingly the output control voltage (VX) 117, which is used by VDGs 110-*a* and 10-*b* to generate therein the appropriate variable VDG bias currents as described in more detail with reference to FIG. 2. An input bias voltage signal (VBIAS) 115 is also received by variable delay VCO 100 and provided to control interface circuit 132 and VDG 110-*a* and VDG 110-*b* to control a set of bias current sources as described in greater detail with reference to FIG. 2 and FIG. 3. In the preferred embodiment, signal conditioning buffers 122 and 127 are coupled to each output port of each VDG 110-*a* and 110-*b* to provide a squaring and limiting function, and to reduce the sensitivity of VDG delay to the load, which may be a variable.

Although voltage controlled ring oscillator 100 of FIG. 1 is shown and described with 2 variable delay gate elements VDG 110-*a* and 110-*b*, other even number combination of VDG elements are envisioned as within the scope and contemplation of this invention.

Figure 2:
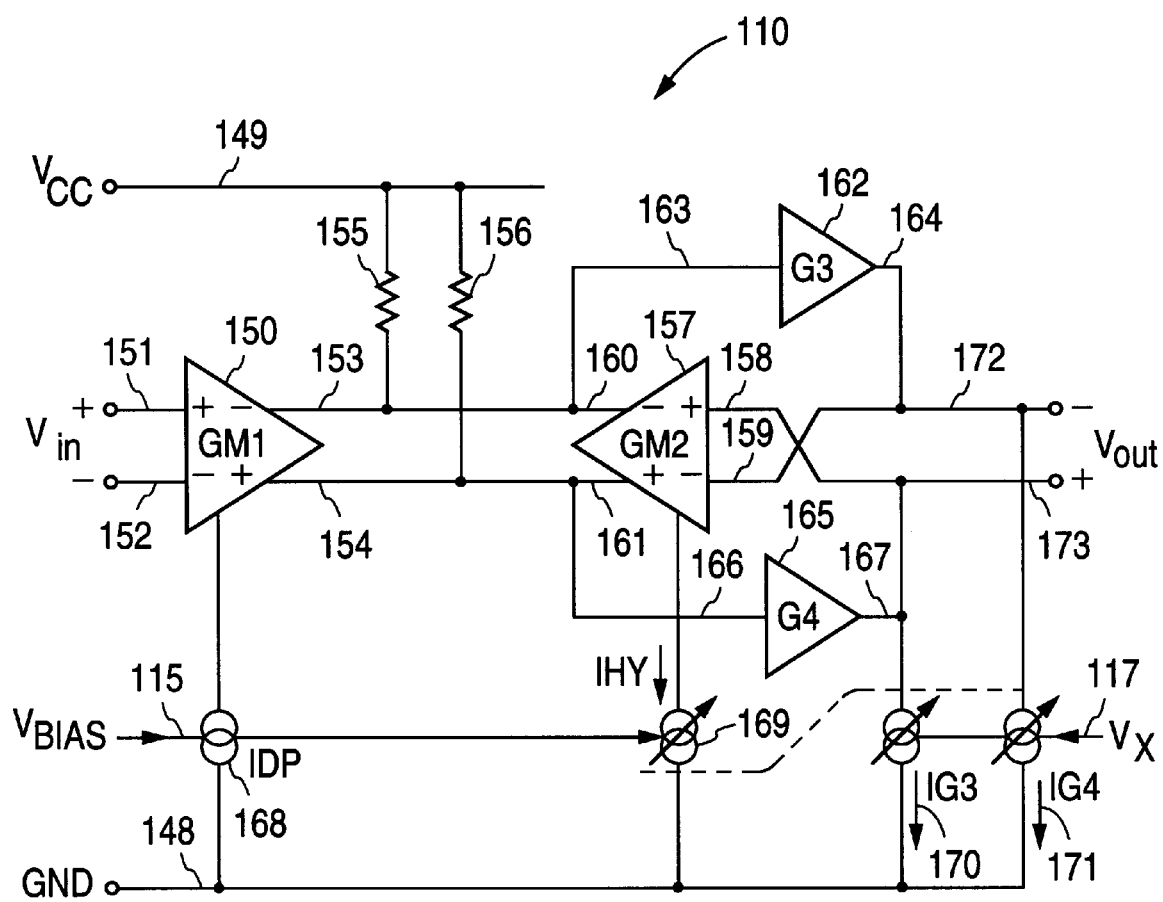
FIG. 2 illustrates a more detailed functional block representation of the variable delay gate of FIG. 1.
Figure 5:
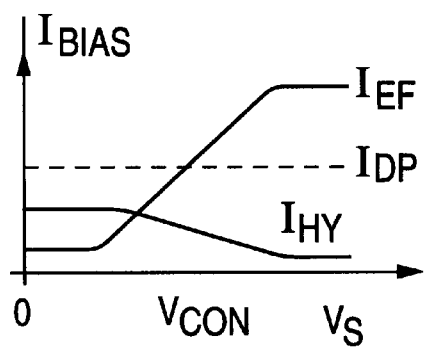
FIG. 5 illustrates the typical functional dependence of various bias currents within the variable delay gates as a function of control voltage signal VCON.

FIG. 2 illustrates a more detailed functional representation of a variable delay gate 110, such as VDG 110-*a* and VDG 110-*b* of FIG. 1. Each VDG 110 comprises two load resistors 155 and 156 with values RL, a differential transconductance gain stage (GM1) 150, a variable bias differential transconductance stage (GM2) 157, and voltage follower stages comprising voltage follower amplifiers (G3) 162 and (G4) 165, the voltage follower amplifiers having associated current sources (IG3) 170 and (IG4) 171, respectively. Voltage control signal VX 117 from control interface circuit 132 of FIG. 1 is coupled to the voltage follower amplifier current sources (IG3) 170 and (IG4) 171 to thereby control the bias currents in response to the value of the VCO input control voltage VCON. GM1 150 comprises a basic differential pair biased by a current source (IDP) 168 which is substantially independent of a VCO 100 input control signal VCON 116 (see FIG. 1). The values of IDP and RL are selected based on the desired oscillation frequency, with the product IDP×RL typically being in the range of 200 mV to 500 mV in a bipolar embodiment. GM2 157 comprises a differential pair also, however it is connected to form a local positive feedback loop through voltage followers G3 and G4. The local positive feedback provides hysteresis action which increases the effective propagation delay of the VDG. The bias currents of voltage followers G3 and G4 are set by IG3 and IG4, which are in turn controlled by voltage VX. For the maximum value of VX, which generates the maximum values of IG3 and IG4, the voltage followers have minimum output resistance and minimum propagation delay. Bias current sources IHY 169 and IG3, IG4 are coupled such that IG3 and IG4 vary directly and monotonically with voltage VCON, while IHY varies inversely with voltage VCON. The desired behavior for the bias currents within the VDG is illustrated in FIG. 5. With the prescribed functional dependence of bias currents within VDG on control voltage VCON, the two delay effects are additive, and together they achieve a wider delay tuning range than possible with either effect alone. This two pronged approach to controlling the delay in the variable delay gate 110 provides a delay adjustment range of greater than an octave, while minimizing complexity and power dissipation in VCO 100 of FIG. 1.

Figure 3:
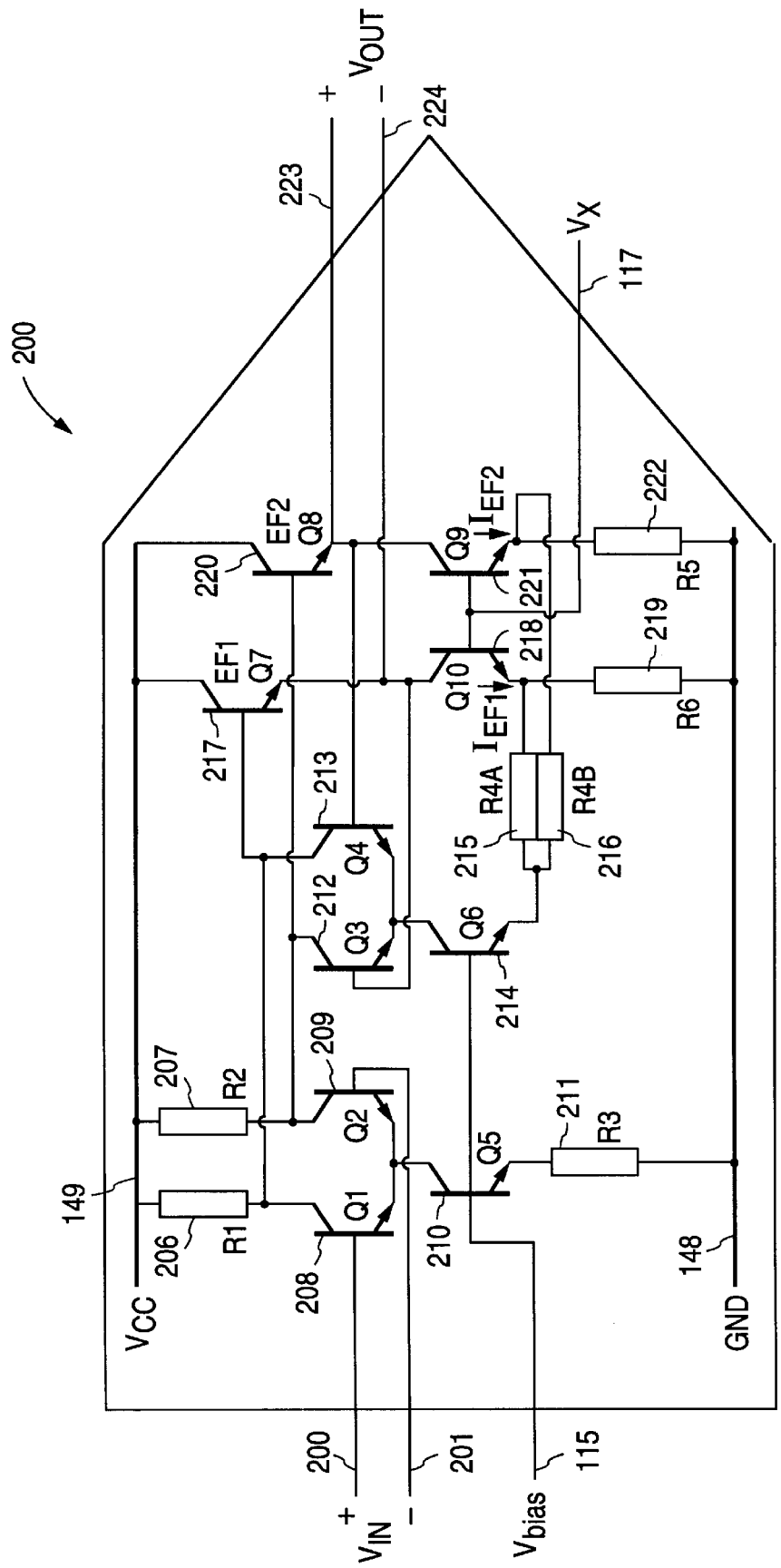
FIG. 3 illustrates a bipolar circuit implementation of the variable delay gate of FIG. 2.

FIG. 3 illustrates a bipolar circuit implementation of VDG 110 of FIG. 2. VDG includes an input differential pair comprising a first transistor (Q1) 208 and a second transistor (Q2) 209, a first load resistor (R1) 206 and a second load resistor (R2) 207 coupled to collectors of differential pair transistors Q1 and Q2, respectively. A first current source (IDP) comprising Q5 210 is coupled to emitters of input differential pair Q1 and Q2. A hysteresis feedback pair comprising transistors Q3 212 and Q4 213 and a current source IHY of the hysteresis stage comprising Q6 214, where the collector outputs of input pair and hysteresis pair are coupled to first and second load resistors R1 and R2. A first voltage follower amplifier comprising a first voltage follower transistor Q7 (EF1) 217 and having an associated first voltage follower current source (IEF1) comprising Q10 218, and a second voltage follower amplifier comprising a second voltage follower transistor Q8 (EF2) 220 and an associated second voltage follower current source (IEF2) comprising Q9 221, where the base inputs of the voltage follower transistors are coupled to the collector outputs of the hysteresis pair, and where the emitter outputs of the followers are coupled to the base inputs of the hysteresis pair as shown in FIG. 3. The hysteresis biasing current source transistor Q6 is coupled to the voltage follower biasing current source transistors Q10 and Q9 through resistors R4A and R4B. This coupling scheme reduces the bias current of the hysteresis pair, when the bias current for the emitter follower stage is increased due to an increase in VX. Preferably, VX should not be allowed to fall below a VBE voltage above GND, otherwise the follower stage would exhibit excessive loss of voltage gain, which could result in a "latched", or a "non-oscillating" state. Thus, for many applications, a latched condition is undesirable and can be avoided by providing a control interface circuit that prevents VX from dropping too low, for any value of VCON between GND and +VCC.

Figure 4:
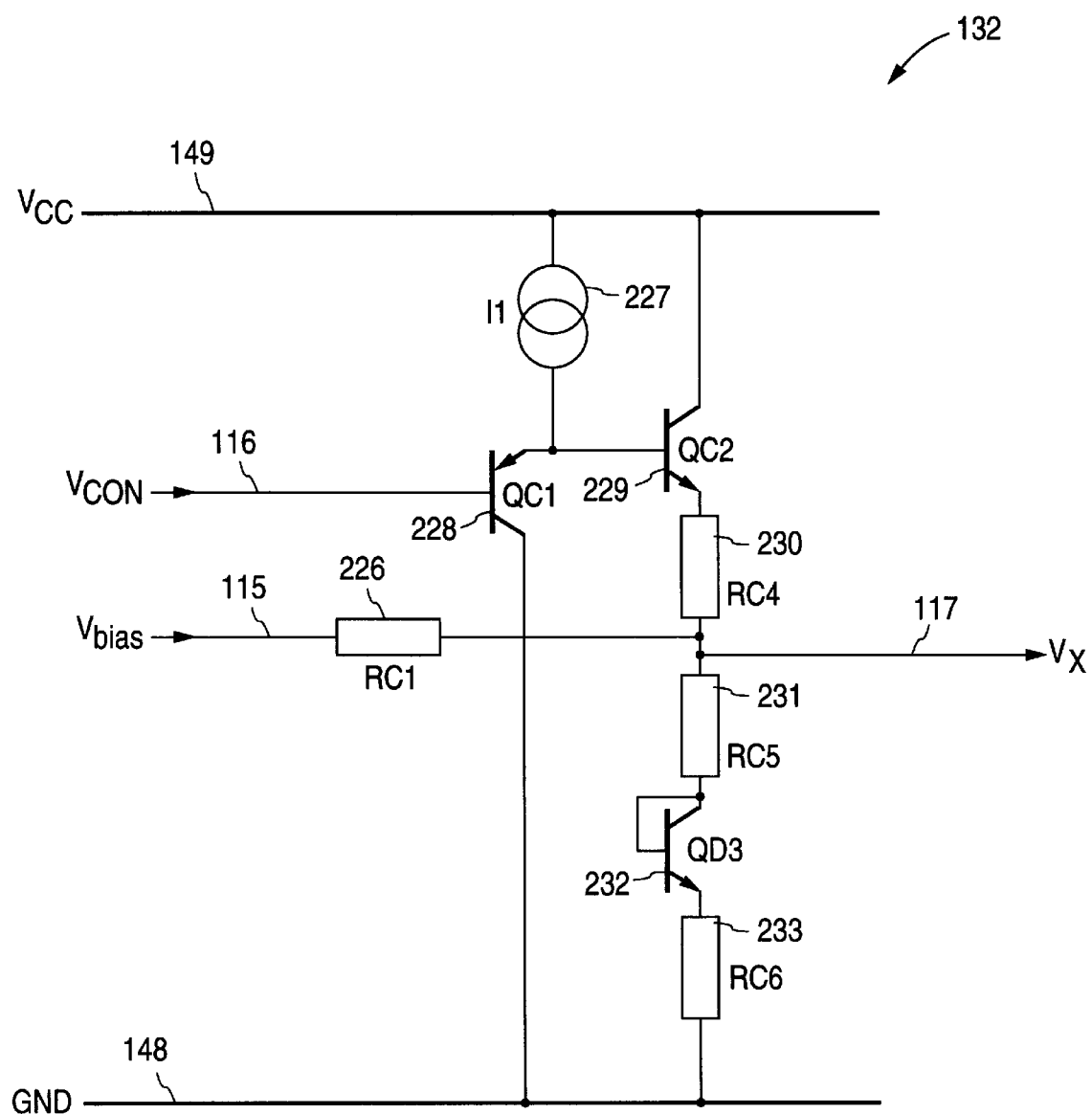
FIG. 4 illustrates a bipolar circuit implementation of the control interface circuit of FIG. 1.

FIG. 4 illustrates a bipolar circuit implementation of control interface circuit (CI) 132 of FIG. 1. Control interface 132 receives an input control voltage signal (VCON) 116, which can range from GND to +VCC, and generates an output voltage signal (VX) 117, which is used by VDGs 110-*a* and 110-*b* (see FIG. 1) to generate the appropriate variable bias currents in the variable delay gates. The circuit behavior of the control interface provides a monotonic transfer function (see FIG. 5) between VDG gate delay (and hence VCO frequency of oscillation) and control voltage VCON 116, for unambiguous frequency lock operating point within a PLL application. For robustness, it is preferable to achieve such monotonic behavior for VCON voltages ranging from 0V to +VCC. This eliminates the need for clamping devices.

The CI circuit generates VX as a monotonic function of VCON. For normal operating VCON voltages, such as for VCON in the voltage range: VBE to VCC-(2×VBE) for bipolar implementations, QC1 228 and QC2 229 are biased as active emitter followers, with voltage gain near unity. VX voltage varies approximately in proportion to VCON voltage, as determined by a voltage divider formed by RC4 230, RC5 231, QD3 232 and RC6 233. For VCON input voltages near zero volts, device QC2 is in cutoff, and VX 117 is set by voltage divider action with current supplied from Vbias 115, through bias string composed of RC1, RC5, QD3 and RC6. Thus a minimum non-zero value for VX is ensured, wherein:

$$VX min = VBE(on) + Vbias \times (RC6 + RC5)/(RC6 + RC5 + RC1)$$

which results in a non-zero minimum value for IEF1 and IEF2. The typical value for Vbias is about +1.1V. Now consider VCON near +VCC. Device QC1 is in cutoff with I1 227 in saturation. The base of QC2 is pulled-up to near +VCC. The value of VX is at a maximum, being set substantially by bias string comprised of QC2, RC4, RC5, QD3 and RC6. Preferably, VX(max) can be set such that emitter follower current source devices Q10 and Q9 (FIG. 3) do not enter saturation, thus ensuring a monotonic relationship over the entire VCON voltage range of GND to +VCC.

Typically, the control input VCON of variable delay gate VCO 100 should have high input impedance, and small input bias current (ideally zero) in order to simplify the loop filter requirements and minimize the in-lock phase error for greatest utility within a PLL application. Since IEF bias currents in VDG 110 vary when VCON is varied, there should be a gain response (i.e., current gain) between the bias current sources IEF1 and IEF2 (assuming a bipolar embodiment) and VCON signal input port at the base of transistor QC1 228. Such current gain is provided for by a Darlington arrangement formed by QC1 228 and QC2 229.

In order for the VCO in FIG. 1 to function as an oscillator, there must be adequate voltage gain (differential output/differential input) from each VDG 110 such that the loop gain around the ring exceeds unity. Furthermore, there must not be so much local positive feedback generated by GM2 stage that a "latched" condition is achieved within VDG 110-$a$ or VDG 110-$b$. The potential for a non-oscillating condition occurs at VCON=0V. Under this condition, the hysteresis stage bias current IHY is at its maximum value and bias currents IEF1 and IEF2 are at their minimum value. The maximum value of the hysteresis current (IHYmax) is set by selecting an appropriate value for R4A and R4B. In the preferred embodiment, R4A=R4B, R5=R6 and (R4/R5)=4. The minimum value of buffer stage current (IEFmin) is determined by VXmin. Under the condition of VCO=0V, device QC2 is in cutoff state, and VX=VXmin is determined by voltage divider action resulting from VBIAS potential across the resistor-diode string formed by RC1 226, RC5 231, QD3 232 RC6 233. In the preferred embodiment, RC1/RC6=5, and RC6/RC5=2.

FIG. 5 illustrates the typical transfer function behavior of VDG bias currents, showing IDP, IHY, IEF (=EF1,=IEF2), as a function of VCON.

Thus, according to the prior art invention, the minimum number of functional components for a VCO with quadrature outputs is two logic gates and two combiner circuits, the invention herein achieves the same function with the equivalent complexity of two combiner circuits. The elimination of two logic gates in a bipolar implementation saves 14 transistors and 10 resistors, thus requiring fewer components and less power to thereby lower device cost.

Although a bipolar circuit implementation is shown in FIGS. 3 and 4, it is contemplated that the principles of this invention may be incorporate using other semiconductor circuit type implementation, for example MOS, CMOS, gallium arsenide, and other such semiconductor circuits The foregoing described embodiments of the invention are provided as an illustration and description. It is not intended to limit the invention to the precise form described. Other variations and embodiments are possible in light of the above teaching, and it is thus intended that the scope of the invention not be limited by the detailed description, but rather by the claims as follow.

We claim:

1. A compact voltage controlled ring oscillator comprising:
   a first variable delay gate and a second variable delay gate, each of the variable delay gates comprising:
      an input port to receive a differential input signal;
      an output port to transmit a differential output signal;
      a fixed bias differential transconductance gain stage (GM1) coupled to the input port to receive the differential input signal and generate correspondingly a differential output current;
      a variable bias differential transconductance hysteresis feedback stage (GM2) having a pair of differential input terminals coupled to a first and a second voltage follower amplifier (G3 and G4) to provide a local positive feedback loop, where a differential output current of GM2 is coupled to the differential output current of GM1 to form a summation of differential currents;
      a pair of load elements which are connected to both a differential output port of GM1 and GM2 to convert the summation of currents to a differential output voltage;
      a voltage follower stage, where a pair of voltage follower stage inputs are coupled to the pair of load elements and a pair of voltage follower stage outputs are coupled to the input port of the other variable delay gate;
      wherein a variable bias current in the voltage follower stage is controlled to vary directly proportionately to a control voltage VX, and a bias current in the transconductance stage GM2 is controlled to vary inversely proportionately to the control voltage VX, and wherein the input port of one variable delay gate is connected to the output port of the other variable delay gate; and
   a control interface (CI) circuit, the control interface circuit receives a VCO input control voltage signal (VCON) and generates correspondingly an output control voltage signal (VX), wherein the control interface circuit is coupled to provide control signal VX to each of the variable delay gates to thereby vary the value of a pair of current sources in the voltage follower stage in opposing direction to the value of a current source in the GM2 stage.

2. A ring oscillator of claim 1 wherein one or more buffers are connected to each output port of each variable delay gate.

3. A ring oscillator of claim 1 wherein one or more resistors couple the current source of the differential transconductance hysteresis feedback stage (GM2) to the pair of current sources of the voltage follower stage, thereby causing the GM2 biasing current to vary inversely with the biasing current sources of the voltage follower stage and varying inversely proportional to the input control signal VCON.

4. A ring oscillator of claim 1 wherein the control interface circuit comprises a non-linear, limiting coupling means between signal VCON and a pair of bias current sources for the voltage follower stage.

5. The ring oscillator of claim 4 where the non-linear, limiting coupling means comprises Darlington pair transistors coupled to a voltage divider string comprised of resistive and non-linear active elements.

6. A ring oscillator of claim 1 wherein the differential transconductance gain stage (GM1) comprises a differential pair bipolar circuit.

7. A ring oscillator of claim 1 wherein the input port of each variable delay gate comprises a non-inverting input and an inverting input, and the output port of each variable delay gate comprises a non-inverting output and an inverting output, and wherein the non-inverting output of one variable delay gate is coupled to the inverting input of the other variable delay gate, while the inverting output of the one variable delay gate is coupled to the non-inverting input of the other variable delay gate to achieve a 180 degree phase inversion of the differential input signal relative to the other variable delay gate.

8. A compact voltage controlled ring oscillator comprising:
- a first variable delay gate and a second variable delay gate, each of the variable delay gates comprising:
  - an input port to receive a differential input signal;
  - a first differential pair bipolar circuit (GM1) coupled to the input port to receive the differential input signal and generate correspondingly a differential pair output signal;
  - a second differential pair bipolar circuit (GM2) coupled at a pair of input terminals of GM2 to a pair of output terminals of an emitter follower stage;
  - a pair of load elements which are connected to both a pair of differential output terminals of GM1 and a pair of differential output terminals of GM2 to convert a summation of currents to a differential output voltage;
  - wherein a pair of emitter follower stage input terminals are coupled to the pair of load elements and the pair of emitter follower stage output terminals are coupled to the input port of the other variable delay gate;
  - an output port, wherein a variable bias current in the emitter follower stage is controlled to vary directly proportionately to a control voltage VX, and a bias current in the transconductance stage GM2 is controlled to vary inversely proportionately to the control voltage VX, and wherein the input port of one variable delay gate is connected to the output port of the other variable delay gate; and
- a control interface (CI) circuit, the control interface circuit receives a VCO input control voltage signal (VCON) and generates correspondingly an output control voltage signal (VX), wherein the control interface circuit is coupled to provide control signal VX to each of the variable delay gates to thereby vary the value of a pair of current sources in the emitter follower stage in opposing direction to the value of a current source in the GM2 stage.

* * * * *